United States Patent
Fu et al.

(10) Patent No.: US 10,825,541 B1
(45) Date of Patent: Nov. 3, 2020

(54) BUILT IN CONFIGURATION MEMORY TEST

(71) Applicant: Xilinx, Inc., San Jose, CA (US)

(72) Inventors: Henry Fu, Milpitas, CA (US);
Weiguang Lu, San Jose, CA (US);
Karthy Rajasekharan, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 17 days.

(21) Appl. No.: 16/150,064

(22) Filed: Oct. 2, 2018

(51) Int. Cl.
G11C 29/10 (2006.01)
G11C 29/36 (2006.01)
G11C 29/38 (2006.01)

(52) U.S. Cl.
CPC .............. *G11C 29/10* (2013.01); *G11C 29/36* (2013.01); *G11C 29/38* (2013.01); *G11C 2029/3602* (2013.01)

(58) Field of Classification Search
CPC ......... G11C 29/10; G11C 29/36; G11C 29/38; G11C 2029/3602
See application file for complete search history.

(56) References Cited

U.S. PATENT DOCUMENTS

| 5,892,961 | A * | 4/1999 | Trimberger ...... H03K 19/17748 712/10 |
| 7,036,059 | B1 * | 4/2006 | Carmichael ......... G06F 11/1004 714/725 |
| 7,216,277 | B1 | 5/2007 | Ngai et al. |
| 7,269,805 | B1 | 9/2007 | Ansari et al. |
| 7,284,229 | B1 | 10/2007 | Trimberger |
| 7,406,670 | B1 | 7/2008 | Ansari et al. |
| 7,409,610 | B1 * | 8/2008 | Drimer .......... G01R 31/318544 326/39 |
| 7,424,655 | B1 | 9/2008 | Trimberger |
| 7,620,863 | B1 | 11/2009 | Trimberger |
| 7,626,874 | B1 | 12/2009 | Fan et al. |
| 7,907,460 | B2 * | 3/2011 | Ngo ................. H03K 19/17764 365/189.02 |

(Continued)

FOREIGN PATENT DOCUMENTS

EP         1183544 B1 * 11/2005   ......... G01R 31/3187

OTHER PUBLICATIONS

Xilinx, Vivado Design Suite Users Guide: Programming and Debugging,2016, Xilinx Inc. (Year: 2016).*

(Continued)

*Primary Examiner* — April Y Blair
*Assistant Examiner* — Matthew W Wahlin
(74) *Attorney, Agent, or Firm* — Patterson + Sheridan, LLP

(57) ABSTRACT

Examples herein describe a self-test process where an integrated circuit includes a test controller responsible for testing a plurality of frames in the memory of an integrated circuit. The test controller can receive a test pattern which the controller duplicates and stores in each of the plurality of frames. However, frames may be non-uniform meaning the frames have varying sizes. As such, some of the frames may only store parts of the test pattern rather than all of it. In any case, the test controller reads out the stored data and generates a checksum which can then be compared to a baseline checksum generated from simulating the integrated circuit using design code to determine whether there is a manufacturing defect in the frames.

20 Claims, 7 Drawing Sheets

(56) References Cited

U.S. PATENT DOCUMENTS

| | | | |
|---|---|---|---|
| 7,958,414 B1 | 6/2011 | Ansari et al. | |
| 9,116,785 B2* | 8/2015 | Ferry | G06F 17/00 |
| 10,446,251 B2* | 10/2019 | Kantipudi | G11C 29/10 |
| 2005/0071730 A1* | 3/2005 | Moyer | H03K 19/17764 |
| | | | 714/758 |

OTHER PUBLICATIONS

Yahun, FPGA Architecture and EDA, 2005, National Univeristy of Singapore (Year: 2005).*

Gong and Diessel, Functional Verification of Dynamically Reconfigurable FPGA-based Systems, 2015, Springer Publishing (Year: 2015).*

Liu and Simmons, BIST-Diagnosis of Interconnect Fault Locations in FPGA's, 2003, CCECE 2003—Canadian Conference on Electrical and Computer Engineering, IEEE (Year: 2003).*

Milton, Dhingra, and Stroud, Embedded Processor Based Built-In Self-Test and Diagnosis of Logic and Memory Resources in FPGAs, 2006, Proceedings of the International Conference on Embedded Systems and Applications (Year: 2006).*

Stroud, A designer's guide to built-in self-test, 2002, Kluwer Academic Publishers (Year: 2002).*

Iniewski (editor), Radiation Effects in Semiconductors, 2011, CRC Press (Year: 2011).*

Holger, Read back scrubbing for SRAM FPGAs in a data processing unit for space instruments, 2015, IEEE (978-1-4673-7501-6/15) (Year: 2015).*

Newalkar, Thesis—Alternative Methods for Built-In Self-Test of Field Programmable Gate Arrays, 2005, Auburn University (Year: 2005).*

Xilinx, "DS112 Virtex-4 Family Overview, data sheet", (v3.1—Aug. 30, 2010) (Year: 2010).*

Xilinx, "ug380—Spartan-6 FPGA Configuration User Guide", (v2.10—Mar. 2017) (Year: 2017).*

* cited by examiner

BUILT IN CONFIGURATION MEMORY TEST

TECHNICAL FIELD

Examples of the present disclosure generally relate to testing non-uniform frames in a configuration memory of an integrated circuit.

BACKGROUND

Programmable integrated circuits (e.g., programmable logic devices, field programmable gate arrays (FPGAs), etc.) include programmable memory cells called configuration memory which store data that configure or program the integrated circuit to perform a desired user function. The configuration memory is often distributed across the integrated circuit. To test the cells of the configuration memory, an external testing application (e.g., a software application) writes and reads data into the memory cells to determine if the data read from the memory cells matches the data written into the memory cells.

The testing application generates a data stream which is transmitted into the integrated circuit which is then stored in the configuration memory. In turn, a data stream containing the data read from the memory cells is then returned to the testing application. The testing application can perform a bit-by-bit analysis to determine if the data written into the configuration memory matches the data read from the configuration memory. Any discrepancy indicates a defect in the configuration memory.

However, transmitting the data into and out of the integrated circuit is limited by the bandwidth of the I/O interface. Because of the large amount of configuration memory in a programmable integrated circuit, transmitting the test data streams to and from the integrated circuit requires a significant amount of time and can be a bottleneck in the manufacturing process.

SUMMARY

Techniques for testing frames of memory are described. One example is a method that includes receiving a test pattern containing data for testing the functionality of a plurality of frames of memory in an integrated circuit and storing the test pattern into each frame of the plurality of frames by repeatedly duplicating the test pattern where the plurality of frames comprises non-uniform frames with varying sizes. The method also includes retrieving data stored in the plurality of frames, generating a first checksum from the retrieved data, and comparing the first checksum to a baseline checksum to determine a functionality of the plurality of frames, wherein the baseline checksum is generated from simulating the integrated circuit using design code.

One example described herein is an integrated circuit that includes a plurality of functional blocks arranged in a row where the plurality of functional blocks comprises a plurality of frames of memory and where the plurality of frames comprises non-uniform frames with varying sizes. The integrated circuit also includes a test controller configured to receive a test pattern containing data for testing a functionality of the plurality of frames, store the test pattern into each frame of the plurality of frames by repeatedly duplicating the test pattern, retrieve data stored in the plurality of frames, and generate a first checksum from the retrieved data, wherein the first checksum is designed to be comparable to a baseline checksum to determine the functionality of the plurality of frames where the baseline checksum is generated from simulating the integrated circuit using design code.

One example described herein is a testing system that includes an integrated circuit, a simulator configured to simulate design code of the integrated circuit to generate baseline checksums derived from storing a test pattern in simulated frames, and a testing application configured to transmit the test pattern to the integrated circuit, receive checksums from the integrated circuit, and compare the checksums to the baseline checksums to determine whether a plurality of frames of memory in the integrated circuit has a defect. The integrated circuit is configured to store the test pattern into each frame of the plurality of frames by repeatedly duplicating the test pattern where the plurality of frames comprises non-uniform frames with varying sizes and generate the checksums from data retrieved from the plurality of frames.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
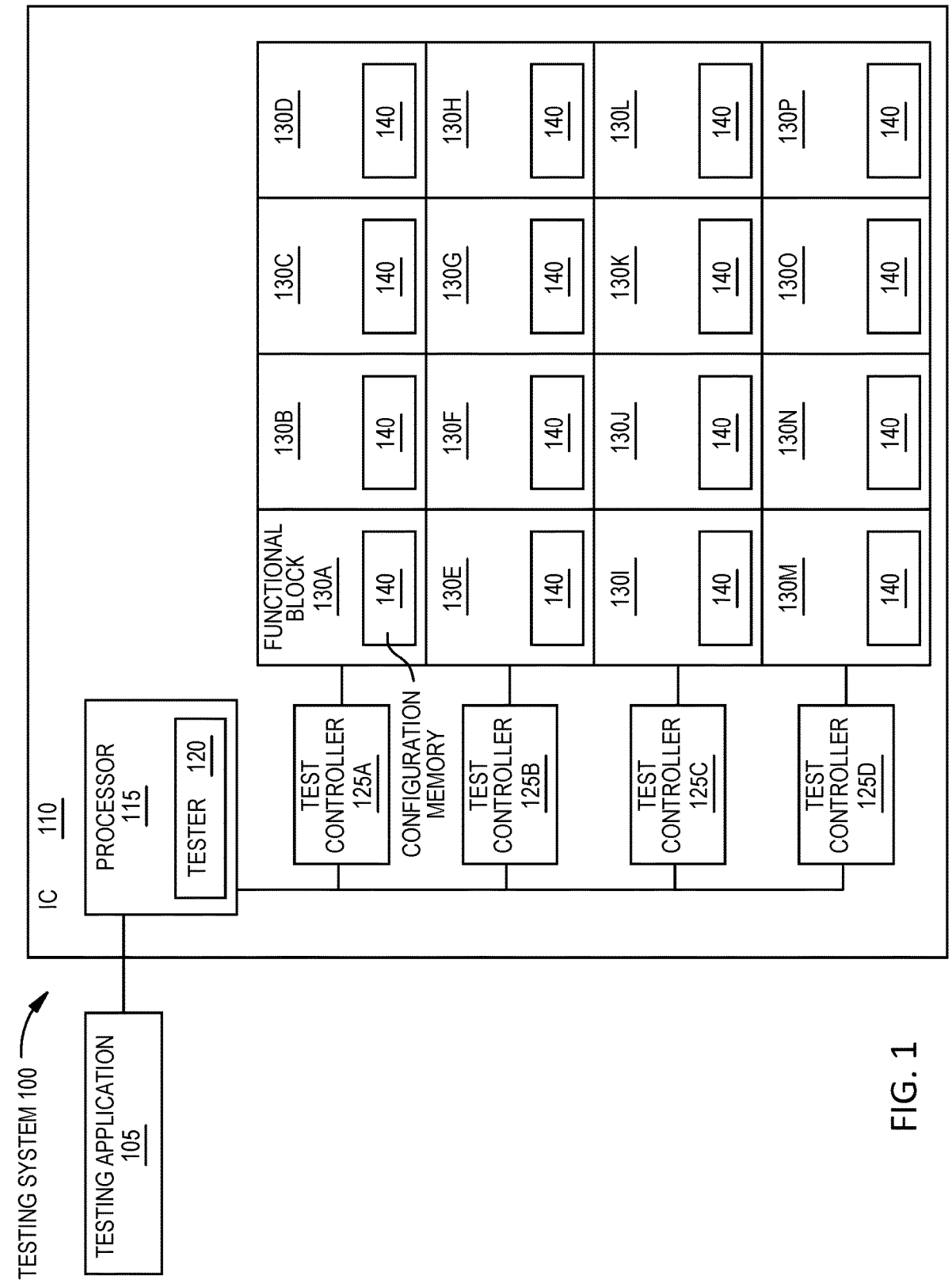
FIG. 1 is a block diagram of a testing system for testing configuration memory in an integrated circuit, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

The embodiments herein describe a self-test process where an integrated circuit includes test controllers responsible for testing a portion of the configuration memory in the integrated circuit. For example, the programmable logic in the integrated circuit may contain functional blocks that are arranged in an array where each functional block contains configuration memory which program or configure the functional block to perform a desired function. The integrated circuit may include a test controller for testing the configuration memory in each row of the functional block.

In one embodiment, a processor in the integrated circuit transmits a test pattern to each test controller. The test pattern, however, may contain only a small amount of the data needed to test the configuration memories in a row of the array. For example, the test pattern may only be one frame of data but the configuration memories in the row may include hundreds, or thousands, of frames. The test controller may include auto-addressing logic which increments a frame address so that the same test pattern can be duplicated and stored in each of the frames. Thus, instead of an external testing application sending a bit stream containing data for testing all the configuration memory in the integrated circuit, the testing application can send only a single frame of data (e.g., the test pattern) which the test controllers can then duplicate and store in the configuration memories.

However, some frames in the configuration memory may be smaller than others. That is, a functional block may contain non-uniform frames where one or more of the frames have fewer memory cells than the other frames. When transmitting a bit stream, the testing application transmits testing data which is customized for the non-uniform frames so that the data read into the configuration memory can be directly compared to data read out from memory cells. However, when storing the same test pattern in non-uniform frames, even if the cells are functioning normally, the data read out from the frames does not match the data read in; thus, performing a direct comparison of the data does not inform the testing application if there is a defect in the configuration memory.

In one embodiment, when reading data out of the frames, the test controller generates a checksum (e.g., a cyclic redundancy check (CRC)) of the read out data. Instead of transmitting the data read out from the memory cells to the external testing application, only the checksum is returned. The testing application can compare the checksum returned to a baseline checksum (which can be generated using a simulated version of the integrated circuit) to determine if the configuration memory in the row has a defect. In this manner, the data transmitted between the integrated circuit and the testing application is greatly reduced. For example, rather than transmitting a bit stream containing customized data for each frame in the configuration memory, the testing application can send one or more test patterns which are duplicated by the test controllers. Moreover, rather than transmitting the data read out from the configuration memories to the testing application, the test controllers can return a single checksum for each row of configuration memories.

In addition to testing non-uniform frames, in one embodiment, the test controller tests for shorts between interleaved frames. That is, the test controller can check whether one frame is shorted to another frame. To do so, the test controller may store the test pattern in all but one of the interleaved frames, which instead stores an inverted test pattern. By repeating the test and storing the inverted test pattern in a different one of the frames each test period, the test controller can identify any shorts between the interleaved frames.

FIG. 1 is a block diagram of a testing system 100 for testing configuration memory 140 in an integrated circuit (IC) 110, according to an example. The testing system 100 includes a testing application 105 (e.g., a software application) that executes on a separate computing system (not shown) communicatively coupled to the IC 110. The testing application 105 generates testing data for testing the configuration memory 140 in the IC 110.

In one embodiment, the input/output (I/O) interface used by the IC 110 has limited bandwidth. As such, instead of providing a bit stream (which includes customized data for each configuration memory 140) to the IC 110, the testing application 105 can transmit one or more testing patterns which may include enough data for testing one frame in the configuration memories 140. As described in more detail below, test controllers 125 in the IC 110 can duplicate the test pattern and store the test pattern in the configuration memories 140. In this manner, the testing application 105 can send a relatively small amount of test data to the IC 110.

In addition to storing the test pattern in the configuration memories 140, the test controller 125 can read out the stored data. Instead of transmitting the read-out data to the testing application 105 (which would then determine if the retrieved data matches the test pattern), the test controllers 125 can each generate a checksum from the retrieved data. The checksums can then be transmitted to the testing application 105 to determine whether they match expected checksums (referred to herein as baseline checksums). Doing so further reduces the amount of bandwidth used at the I/O interface between the IC 110 and the testing application 105.

In FIG. 1, the IC 110 is a programmable IC (e.g., a programmable logic circuit or a FPGA) which includes an array of functional blocks 130 arranged in rows and columns. The functional blocks 130 can include the same or different types of circuitry. For example, the functional blocks 130 can be look-up tables formed from memory elements (e.g., RAM), digital signal processors, math engines, etc. When programming the IC 110, the configuration memories 140 are loaded with data which configure programmable logic in the functional blocks 130 to perform a desired user function. The embodiments herein describe various techniques for testing the configuration memories 140 when manufacturing the IC 110 to ensure proper functionality.

In addition to the functional blocks 130, the IC 110 includes a processor 115 and the test controllers 125 which may be hardened circuitry (e.g., non-programmable circuitry) in contrast to the programmable logic or circuitry in the functional blocks 130. The processor 115 includes a tester 120 which can be circuitry or firmware which controls the operation of the test controller 125. In this example, the IC 110 includes a test controller 125 for testing the configuration memories 140 in each row of the array of functional blocks 130. That is, the test controller 125A tests the memories 140 in the functional blocks 130A-130D, the test controller 125B tests the memories 140 in the functional blocks 130E-130H, and so forth. However, in other embodiments, a test controller 125 may test multiple rows of the functional blocks 130, or a single testing controller 125 may test the configuration memories 140 in all the functional blocks 130. Providing a test controller 125 for each row as shown FIG. 1 means the rows can be tested in parallel, but is a tradeoff since doing so adds additional circuitry in the IC 110.

Figure 2:
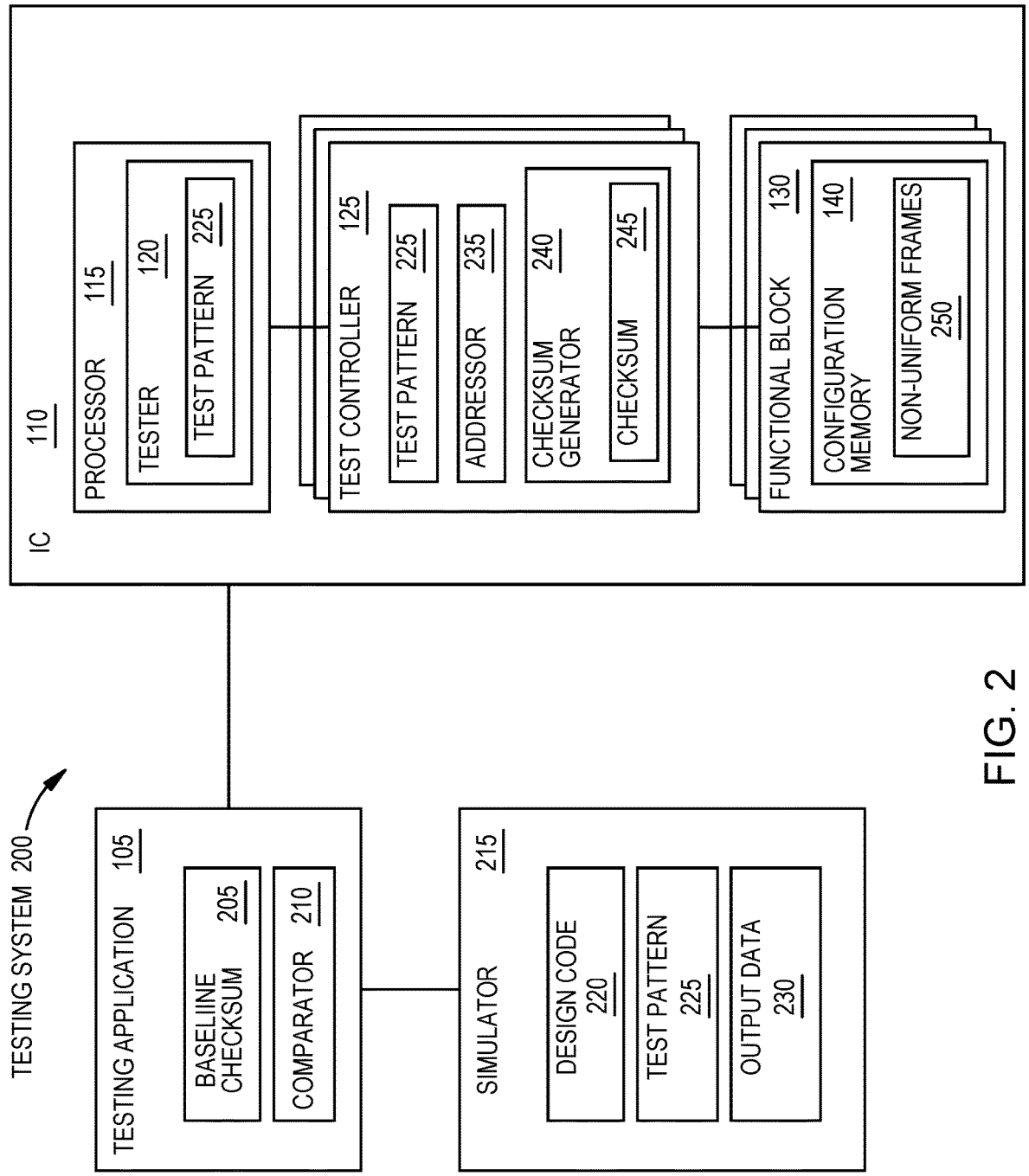
FIG. 2 is a block diagram of a testing system for testing configuration memory with non-uniform frames, according to an example.

FIG. 2 is a block diagram of a testing system 200 for testing configuration memory 140 with non-uniform frames 250, according to an example. The testing system 200 includes the testing application 105, a simulator 215, and the IC 110. The testing application 105 includes baseline checksums 205 which are compared to checksums 245 received from the test controllers 125 in the IC 110 by a comparator 210. If the checksums match, this means the configuration memories 140 are functioning as expected.

In one embodiment, the simulator 215 generates the baseline checksums 205 using design code 220 of the IC 110. The design code 220 may include hardware description language (HDL) or other hardware design code which represents the circuitry and components in the IC 110 (e.g., the functional blocks 130 and the configuration memory 140). The simulator 215 may be a software application that simulates the design code 220 to represent the actual function of the IC 110. That is, the simulator 215 behaves and functions like the IC 110 but without any manufacturing defects. As such, the simulators 215 can use the test pattern 225 to test the design code 220 to determine how the design code 220 behaves. Put differently, the simulator 215 can store the test pattern in configuration memory in the design code 220 and then derive the baseline checksums 205 (e.g., a CRC value) from output data 230 generated by storing the test pattern 225. For example, the output data 230 can include the data read from the configuration memory in response to storing the test pattern 225. By generating the baseline checksums 205 from the output data 230, the simulator 215 can identify the ideal (or expected) checksums when the IC 110 does not include any manufacturing defects. Thus, by comparing the baseline checksums 205 to the actual checksums 245 retrieved from the IC 110, the testing application 105 can identify defects in the configuration memory 140 in the actual IC 110.

The IC 110 includes the processor 115, the test controller 125, and multiple functional blocks 130. The processor 115 may be hardened logic that includes the tester 120. In one embodiment, using the I/O interface coupled to the testing application 105, the testing application 105 transmits the test pattern 225 to the tester 120.

The tester 120 is also communicatively coupled to the test controllers 125 which may also be hardened logic in the IC 110. Each of the test controllers 125 may be responsible for testing a particular set of the functional blocks 130 (e.g., the functional blocks 130 in a particular row, multiple rows, half of a row, a particular column, multiple columns, or half of a column). To do so, each test controller 125 receives the test pattern 225 from the tester 120. In one embodiment, the tester 120 sends the same test pattern 225 to each test controller 125, but in other examples, different test controllers 125 may receive different test patterns 225.

The test controllers 125 also include an addressor 235 for addressing each of the functional blocks 130 assigned to the respective test controller 125. That is, the addressor 235 can increment a pointer to the configuration memory 140 so that the test controller 125 can store the test pattern 225 in each of the configuration memories 140 assigned to the test controller 125.

The test controllers 125 include a checksum generator 240 which generates the checksum 245 from the resulting data read from the configuration memory 140. That is, after storing the test pattern 225 into the configuration memory 140, the test controller 125 reads out the data stored in the configuration memory 140. Instead of sending the read-out data to the testing application 105, the checksum generator 240 generates the checksum 245 which is transmitted to the tester 120 and then eventually to the comparator 210 in the testing application 105. Doing so avoids having to transmit the entire read-out data via the I/O interface between the IC 110 and the testing application 105.

In one embodiment, the functional blocks 130 include configuration memory 140 which has non-uniform frames 250. In this example, the configuration memory 140 is subdivided into frames which have varying length. Some of the frames may be uniform—i.e., have the same size or length (e.g., a 3200 bit chunk of memory)—while others are non-uniform where one or more of the frames has a different size or length than the other frames in the memory 140. For example, one of more of the non-uniform frames 250 may be smaller than the rest. Because the test pattern 225 may be a fixed size, the test pattern 225 may have too much data or insufficient data for testing the frames 250. For example, if the frame can store less data than what is in the test pattern 225, the non-existent memory cells may be read back as a constant value—e.g., a one. Thus, the test controller 125 cannot directly compare the read-out value to the test pattern 225 when there are non-uniform frames 250 in the configuration memory. As described below, calculating checksums 245 and comparing these to the baseline checksums 205 generated by the simulator 215 permit the testing application 105 to use a small test pattern 225 to test the non-uniform frames 250 without having to generate a large data stream that is customized for the non-uniform frames 250 in the configuration memories 140.

Figure 3:
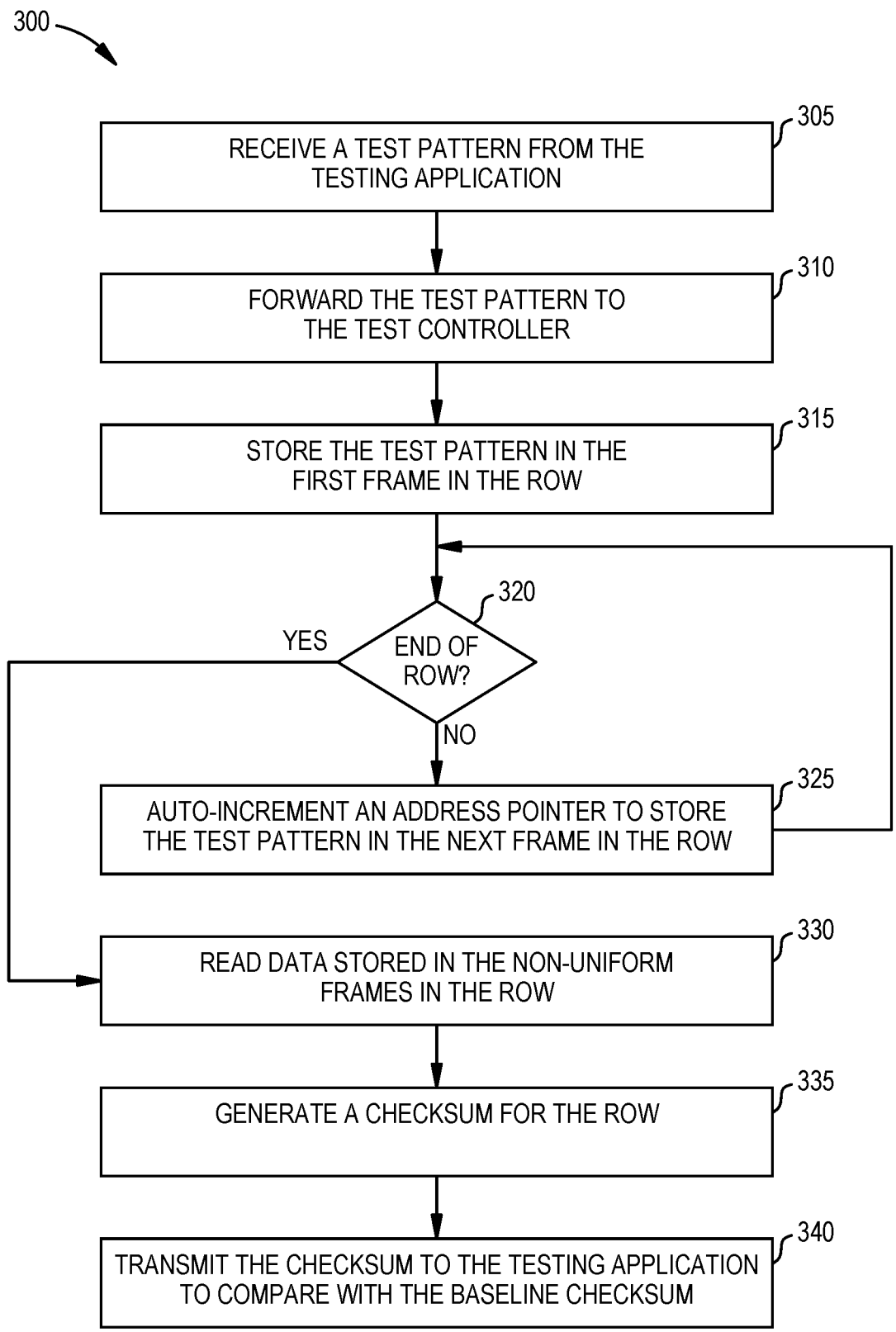
FIG. 3 is a flowchart for testing configuration memory with non-uniform frames, according to an example.

FIG. 3 is a flowchart of a method 300 for testing configuration memory with non-uniform frames, according to an example. At block 305, the tester in the IC receives a test pattern from a testing application. As mentioned above, the test pattern may have a fixed size that can fill a frame (or multiple frames) in a configuration memory. However, some of the frames may be different lengths, and thus, can store more or less data than the test pattern. Nonetheless, the same test pattern can be stored in each of the non-uniform frames.

At block 310, the tester forwards the test pattern to the test controller responsible for testing one or more of the functional blocks. The test pattern can be the same bit pattern for each of the blocks (e.g., all zeros, all ones, or some combination of both) or may be different for one or more of the test controllers.

At block 315, the test controller writes the test pattern into a first frame in the row. For example, the addressor in the test controller may initially be set to a first address with points to the first frame of the configuration memory in the first functional block in the row assigned to the test controller.

At block 320, the test controller determines whether the addressor is pointing to the end of the row, or stated differently, the last frame in the configuration memory of the functional block at the end of the row. While method 300 assumes each test controller is assigned to test one row of the functional blocks, in other examples, the test controller may test only a portion of the blocks in a row (e.g., the first half or last half) or may test multiple rows of functional blocks. In any case, method 300 can be generalized such that at block 320 the test controller determines whether the addressor has reached the last frame in the last functional block assigned to be tested by the test controller.

If the addressor has not reached the last frame, the method 300 proceeds to block 325 where the addressor auto-increments its address pointer (i.e., without receiving a prompt for an outside hardware element such as the tester) to write the test pattern in the next frame in the row. For example, each functional block may include any number of frames in its configuration memory. The addressor can auto-increment through each frame until reaching the next functional block in the row and then auto-increment through frames in the next functional block until finally reaching an end of the functional blocks assigned to the test controller. When incrementing the address pointer, the test controller can store a duplicate of the test pattern in each frame, regardless if the frame can store the entire test pattern or only a portion of the test pattern.

At block 330, the test controller reads data stored in the non-uniform frames in the row. As mentioned above, the frames in the configuration memory in one or more of the functional blocks may be non-uniform, and thus, have different sizes. When reading out the data stored in the frame that has the same size of the test pattern, the read-out data should be the same as the test pattern (assuming there is no manufacturing defect in the memory cells forming the frame). However, when reading out the data stored in a frame that has a different size as the test pattern, the read-out data may not match the test pattern even if the memory cells do not have a manufacturing defect (e.g., are behaving as designed or expected).

Figure 4:
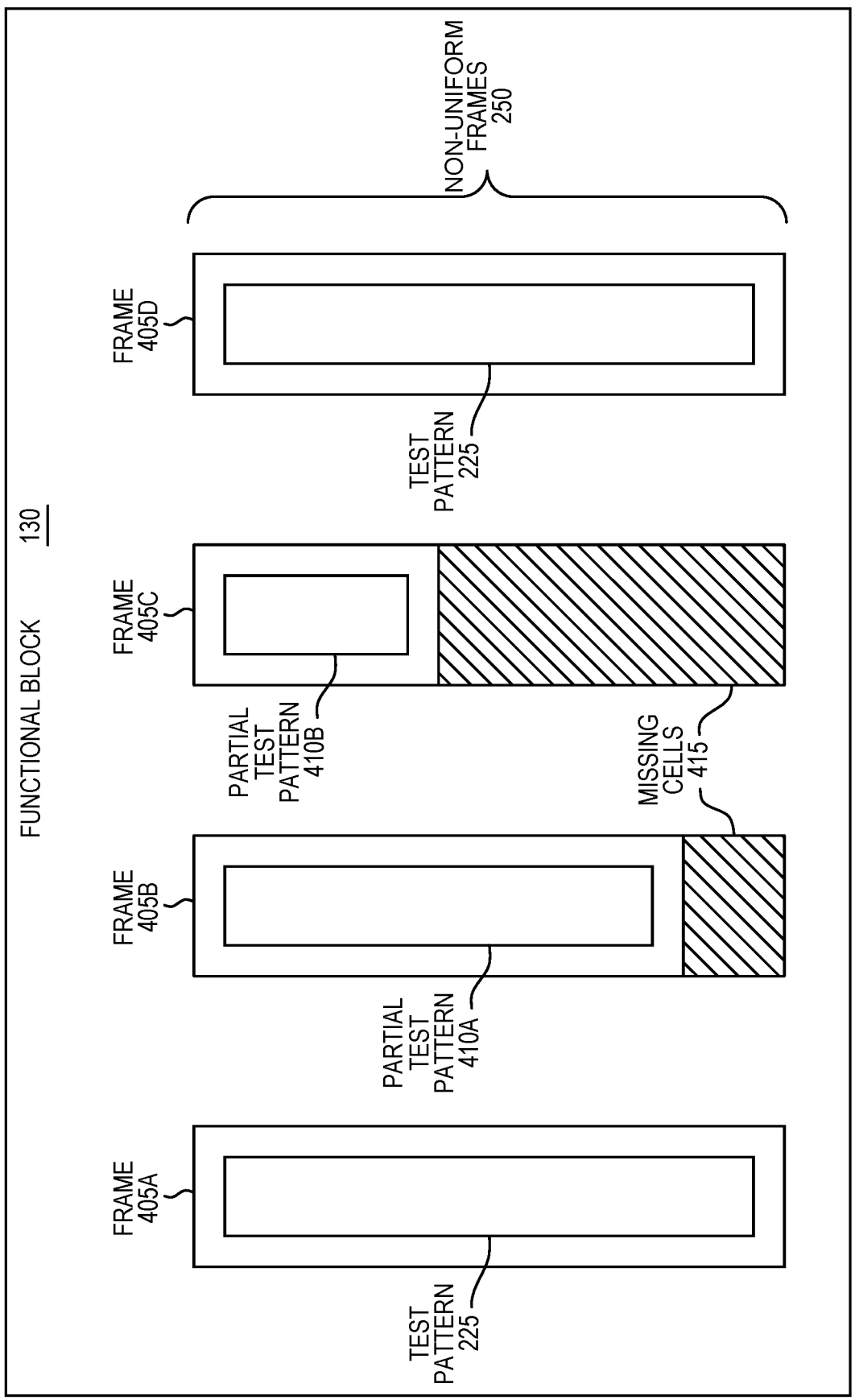
FIG. 4 illustrates non-uniform frames in a functional block, according to an example.

FIG. 4 non-uniform frames 250 in a functional block 130, according to an example. The non-illustrates uniform frames 250 include frames 405A-405D which store at least a portion of the test pattern 225. In this example, the frames 405A and 405D have enough memory cells to store the entire test pattern 225. For example, when generating the test pattern 225, the testing application may put enough data in the pattern 225 to fill the largest frame 405 in the functional block 130.

However, the frames 405B and 405C are smaller than the frames 405A and 405D (e.g., have fewer memory cells) and thus store partial test frames 410A and 410B, respectively. The shaded portions in the frames 405B and 405C illustrate missing memory cells 415 which make the frames 405B and 405C smaller than the frames 405A and 405D. As a result, when reading out the data stored in the frames 405B and 405C, the resulting data does not match the test pattern 225 even if the memory cells forming these frames are behaving properly since only a portion of the test pattern was stored in those frames. Thus, the test pattern 225 cannot directly be compared to the data read from the frames 405B and 405C to determine if the frames 405B and 405C were manufactured properly. For example, when reading from the frames 405B and 405C, the portion of the test patterns that would have been stored in the missing memory cells 415 may always return the same constant value, e.g., all ones or zeros. Thus, these portions of the read-out data might not match the corresponding values in the test pattern 225.

Returning to the method 300, to avoid the issue of the read-out data for non-uniform frames not matching the test pattern, at block 335 the checksum generator in the test controller generates a checksum for the data read-out of the row. The checksum may be a CRC value but the embodiments herein are not limited to such and can be parity check values or other types of checksums.

At block 340, the test controller transmits the checksum to the testing application to compare with a baseline checksum generated by the simulator. Because the configuration memory in the IC design code has the same non-uniform frames as the configuration memory in the actual, physical IC, the read-out data generated by the simulator (and the resulting baseline checksum) should match the checksum generated by the test controller on the physical IC. Put differently, the output data generated by simulating the design code of the IC (which simulates the same non-uniform frames in the actual IC) should match the read-out data retrieved by the test controller. Thus, the testing application could directly compare the read-out data to the output data generated by the simulator, but this would mean the IC would have to transmit the read-out data to the testing application, which would use a considerable amount of bandwidth. Instead, the test controller can generate a checksum from the read-out data (which is much smaller than the read-out data itself) which is then transmitted from the IC to the testing application and compared to the baseline checksum to determine whether the memory cells in the configuration memory have a defect.

In another embodiment, rather than transmitting the checksums to the testing application, when transmitting the test pattern to the integrated circuit the testing application can also transmit the baseline checksums to the integrated circuit. Thus, when the tester receives the checksums from the test controller, the tester already has the baseline checksums. In this example, the tester can compare the checksums received from the test controller to the baseline checksums (rather than the comparator on the testing application) and return the results to the testing application.

Figure 5:
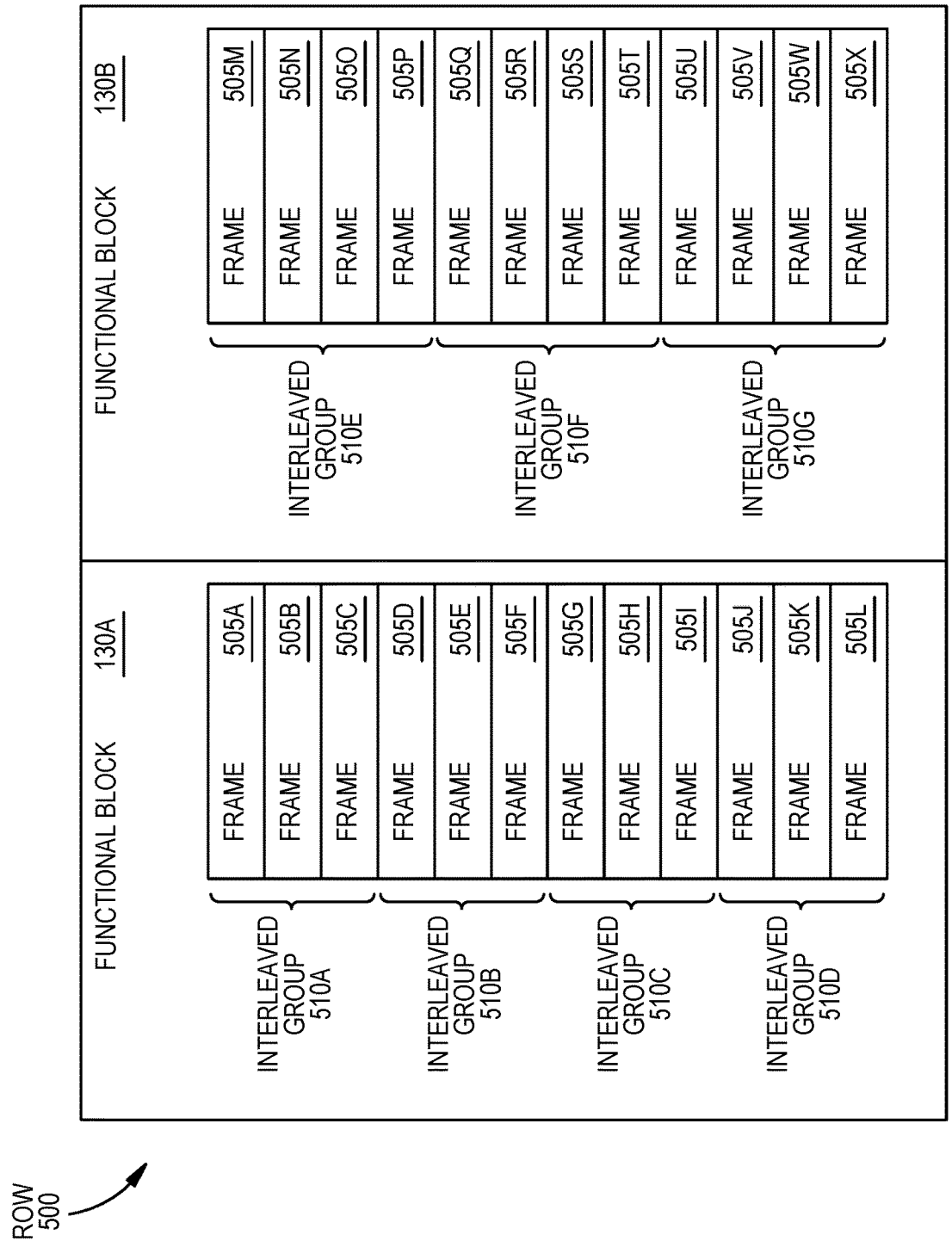
FIG. 5 illustrates interleaved frames in functional blocks, according to an example.

FIG. 5 illustrates interleaved frames 505 in functional blocks 130 in a same row 500, according to an example. The frames 505 in the FIG. 5 can be either uniform or non-uniform frames. FIG. 5 illustrates that the interleaved frames 505 can be assigned to interleaved groups 510. In the functional block 130A, the interleaved groups 510A-510D each includes three of the interleaved frames 505. However, in the functional block 130G, the interleaved groups 510E-510G each include four of the interleaved frames 505. FIG. 5, however, is just one example of how the frames 505 can be arranged into interleaved groups. Further, some functional blocks 130 may not have any interleaved frames.

Generally, the frames 505 in the same interleaved groups 510 are interconnected. For example, in one physical column of memory, the memory cells are interleaved to form multiple frames. In one embodiment, each frame in the column is controlled by one address line (which extends vertically). Each data line (which extends horizontally) connects to the memory cells forming the multiple frames. That is, the output of one of the frames is coupled to the input of another frame. In one embodiment, interleaving the memory cells in a column can help with Single Event Upset (SEU) mitigation. In the case where an error correction code (ECC) is implemented for each frame, ECC can only fix a single bit error, and detect two bit errors. But a SEU event can potentially flip multiple bits by a strike from a single high energy particle. In the case of 4-way interleaving, so long as no more than 4 continuous (vertical) memory cells are flipped, the ECC across 4 frames can detect and correct the bit error.

Due to manufacturing defects, the memory cells in one frame 505 can be shorted to a memory cell in another frame 505 in the same interleaved group 510. Thus, storing data in one frame 505 in the interleaved group 510 may result in that data being copied into a memory cell in another one of the frames 505 in the same group 510. As such, storing the same test pattern in all the interleaved frames 505 may not be sufficient for detecting a short between the memory cells in the interleaved frames 505 assigned to the same group 510. That is, if two memory cells are shorted together, because the test pattern is the same, the same read-out data is retrieved regardless of the presence of a short.

Figure 6:
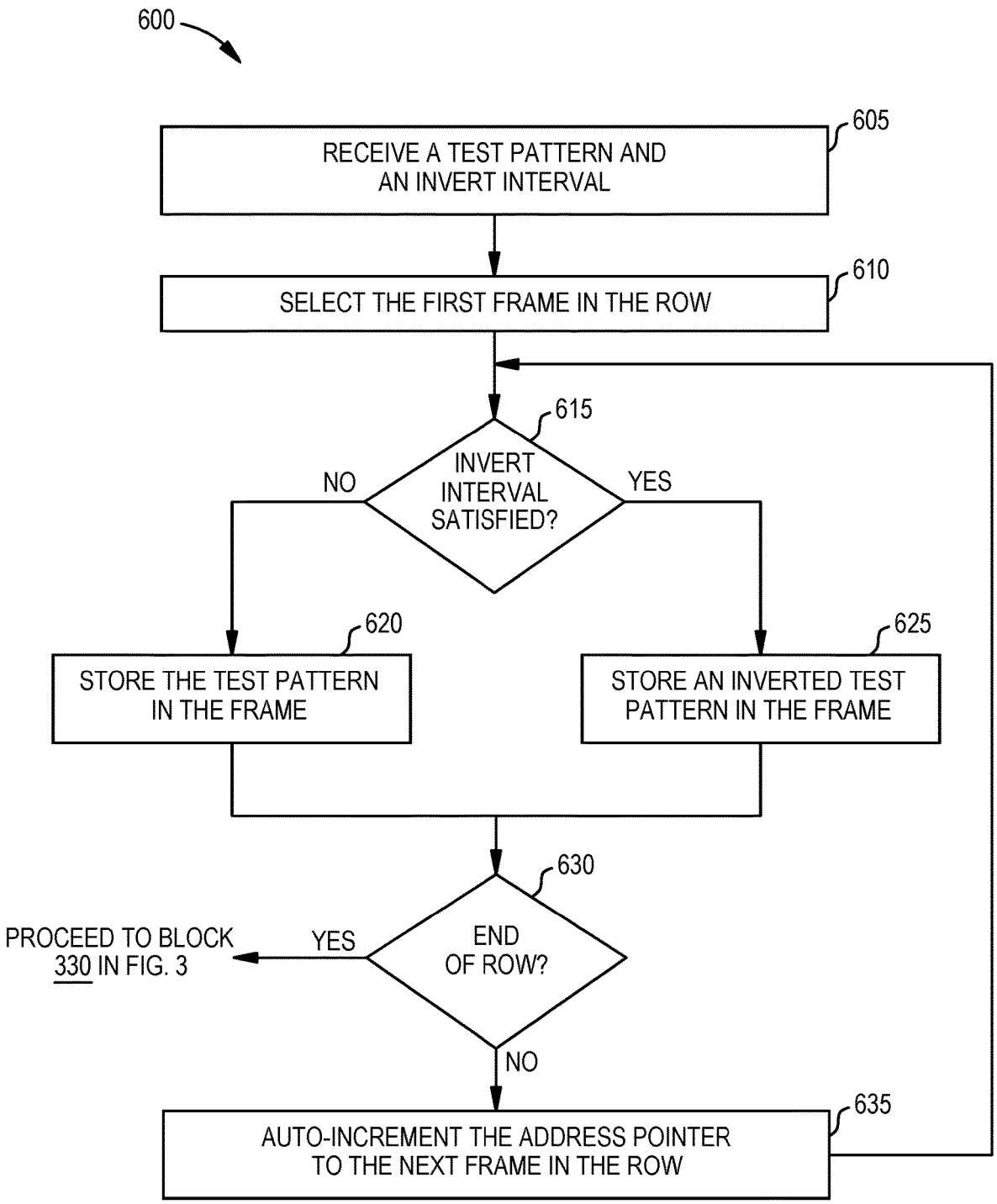
FIG. 6 is a flowchart for testing interleaved frames, according to an example.

FIG. 6 is a flowchart of a method 600 for testing interleaved frames to detect shorts between the frames, according to an example. The method 600 can be used to test interleaved frames that are uniform or non-uniform in length. Generally, the method 600 can detect when there are shorts between interleaved frames in the same interleaved group.

At block 605, the test controller receives a test pattern and an invert interval from the tester. For example, the tester may know how the frames in each of the functional blocks are interleaved (e.g., groups of three, four, five, six, seven, etc.) and provide the invert interval to the test controller based on this knowledge. As described in more detail below, the test controller uses the invert interval (which defines a ratio) to invert the test pattern before storing the inverted test pattern into one of the frames. For example, if the invert interval has a ratio of three, the test controller inverts the test pattern every third frame—e.g., storing 101010 . . . instead of 010101.

At block 610, the test controller selects the first frame in the row (i.e., the first frame in the first functional block assigned to the test controller). At block 615, the test controller determines whether the invert interval is satisfied. For example, the invert interval may indicate the test controller should invert the first frame and every seventh frame thereafter, or invert every other frame in the interleaved group If the invert interval is satisfied, the method 600 proceeds to block 625 where the test controller writes an inverted test pattern into the frame. Otherwise, the method proceeds to block 620 where the test controller writes the test pattern (without being inverted) into the frame.

At block 630, the test controller determines whether it has arrived at the end of the row, or in other words, whether the test controller has loaded the test pattern (or the inverted test pattern) into the frames of all the functional blocks assigned to the test controller. If not, the method 600 proceeds to block 635 where the addressor in the test controller auto-increments the address pointer to the next frame in the row and the method 600 returns to block 615 to store either the normal or inverted test pattern into the next frame according to the invert interval.

However, when the address pointer reaches the last frame at block 630, the method 600 proceeds to block 330 of FIG. 3 where the test controller reads the data out of the frames in the row and generates a checksum from the read out data. If there is a short between interleaved frames that stores in the inverted test pattern, then the data is corrupted by a neighboring frame which alters the checksum. Like above, the simulator can simulate the IC design and store the test patterns using the same invert interval. By reading out the data stored in the frames during simulation, the simulator can generate the baseline checksums which are compared to the checksums generated by performing the method 600. In this manner, the test controller can determine whether a frame that stores the inverted test pattern is shorted to neighboring interleaved frames in the interleaved group.

Figure 7:
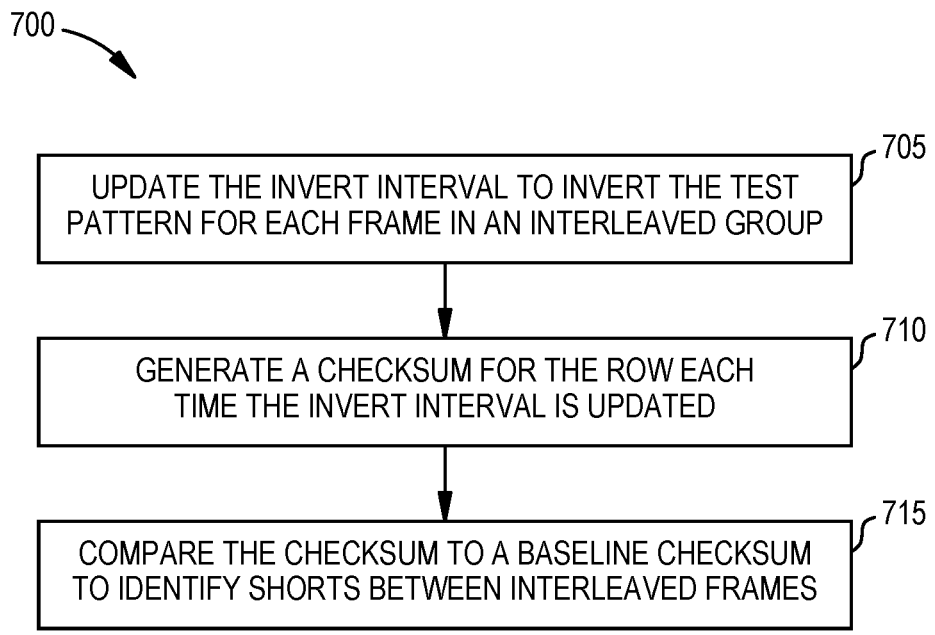
FIG. 7 is a flowchart for identifying shorts between interleaved frames, according to an example.

FIG. 7 is a flowchart of a method 700 for identifying shorts between interleaved frames, according to an example. Using the method 600, the test controller can store an inverted test pattern in one frame in each interleaved group, thereby determining whether the frame storing the inverted test pattern is shorted to neighboring frames in the group. The method 700 describes repeating the method 600 so that the test controller can test each of the frames in the interleaved groups to determine if any one of the frames has a short to a neighboring frame.

At block 705, the tester updates the invert interval to invert the test pattern for each frame in an interleaved group of frames. For example, during a first test period, the invert interval indicates the test controller should invert the first frame and every seventh frame thereafter. However, in a second test period, the tester updates the invert interval to instruct the test controller to invert the second frame and then every seventh frame thereafter. In a third test period, the tester updates the invert interval to instruct the test controller to invert the third frame and then every seventh frame thereafter. In one embodiment, the tester continues to update the invert interval until each frame in the interleaved group stores the inverted test pattern during a test period. For example, if each of the functional blocks assigned to the test controller has interleaved groups that each has five frames, the invert interval is updated at least five times. In another example, the test controller inverts multiple frames in the same interleaved group at the same time. For example, the first frame in the group may store the normal test pattern, the second frame in the group stores the inverted test pattern, the third frame in the group stores the normal test pattern, the fourth frame in the group stores the inverted test pattern, and so forth. During the next test period, this assignment is reversed.

However, the functional blocks assigned to the test controller do not have to have the same size interleaved groups. For example, the first functional block may have interleaved groups that each has three frames while the second functional block has interleaved groups that each has four frames. The invert interval provided by the tester may indicate when to switch from inverting every third frame to every fifth frame. For example, if the first and second functional blocks each have twelve frames, the invert interval may instruct the test controller to invert every third frame but switch to inverting every fifth frame when the address pointer reaches the thirteenth frame (i.e., the first frame in the second functional block). In this manner, the test controller can test functional blocks that have different size interleaved groups.

At block 710, the checksum generator generates a checksum for the row each time the invert interval is updated. That is, each time the test controller stores the normal and inverted test pattern in the row using one version of the invert interval, the test controller can read out data from the frames which the checksum generator uses to calculate a checksum. Thus, if each functional block in the row assigned to the test controller has interleaved groups with five frames, the invert interval is updated five times and the checksum generator generates five checksums.

In another embodiment, rather than generating a checksum each time the invert interval is updated, the test controller can store the read-out data during each test period and then generate one checksum for all the updated invert intervals. Doing so may mean fewer checksums are transmitted to the test application although it may mean the test controller uses more memory to store the read-out data from all the invert interval updates.

At block 715, the comparator in the testing application compares the checksums provided by the checksum generator in the test controller to the baseline checksums to identify shorts between interleaved frames. By updating the invert intervals, the test controller can test each of the frames in the interleaved groups separately. If any of the checksums do not match the baseline checksums, the testing application knows that at least one frame in the configuration memories of the functional blocks is defective.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method, comprising:
   receiving a test pattern containing data for testing the functionality of a plurality of frames of configuration memory in an integrated circuit, wherein the integrated circuit comprises a plurality of functional blocks arranged in a plurality of rows, wherein each of the plurality of functional blocks contains a portion of the plurality of frames;

storing the test pattern into each frame of the plurality of frames by repeatedly duplicating the test pattern, wherein the plurality of frames comprises non-uniform frames with varying sizes;

retrieving data stored in the plurality of frames;

generating a first checksum from the retrieved data; and comparing the first checksum to a baseline checksum to determine a functionality of the plurality of frames, wherein the baseline checksum is generated from simulating the integrated circuit using design code.

2. The method of claim 1, wherein the plurality of frames comprises a first frame and a second frame, wherein the first frame has a size that matches a size of the test pattern but the second frame lacks sufficient memory cells for storing the test pattern, wherein, when retrieving data stored in the first frame, the retrieved data matches the test pattern when the first frame is functioning properly, wherein, when retrieving data stored in the second frame, the retrieved data is different from the test pattern when the second frame is functioning properly.

3. The method of claim 2, wherein the second frame returns a constant value for a portion of the test pattern that was unable to be stored in the second frame when storing the test pattern into each frame of the plurality of frames.

4. The method of claim 1, further comprising:

before comparing the first checksum to the baseline checksum, at least one of (i) transmitting the first checksum from the integrated circuit to a testing application external to the integrated circuit, wherein the testing application stores a plurality of baseline checksums and (ii) receiving the baseline checksum from the testing application.

5. The method of claim 1, further comprising:

auto-incrementing an address pointer when storing the test pattern into each frame of the plurality of frames, wherein the address pointer points to one of the plurality of frames in one of the plurality of functional blocks.

6. The method of claim 1, wherein the plurality of frames are arranged into a plurality of interleaved groups, wherein each of the plurality of interleaved group comprises multiple frames of the plurality of frames, wherein the method comprises:

receiving an invert interval, the invert interval comprising a ratio indicating when to invert the test pattern when storing the test pattern into the plurality of frames, wherein content of only one of the frames in each of the plurality of interleaved groups is inverted at any given time.

7. The method of claim 6, further comprising:

receiving an updated invert interval;

storing again the test pattern into each frame of the plurality of frames by repeatedly duplicating the test pattern using the updated invert interval, wherein content of a different one of the plurality of frames in each of the plurality of interleaved groups is inverted than when storing the test pattern into the plurality of frames using a previous invert interval;

retrieving data stored in the plurality of frames;

generating a second checksum from the retrieved data; and comparing the second checksum to a second baseline checksum to determine the functionality of the plurality of frames.

8. The method of claim 7, further comprising:

updating the invert interval until content of each frame in the plurality of interleaved groups is inverted during at least one test period, wherein inverting the content of each frame in the plurality of interleaved groups permits a testing application to determine whether there is a short between frames in a same interleaved group.

9. An integrated circuit comprising:

a plurality of functional blocks arranged in a plurality of rows, wherein the plurality of functional blocks comprises a plurality of frames of configuration memory, wherein each of the plurality of functional blocks contains a portion of the plurality of frames, wherein the plurality of frames comprises non-uniform frames with varying sizes; and a test controller configured to:

receive a test pattern containing data for testing a functionality of the plurality of frames, store the test pattern into each frame of the plurality of frames by repeatedly duplicating the test pattern, retrieve data stored in the plurality of frames, and generate a first checksum from the retrieved data, wherein the first checksum is designed to be comparable to a baseline checksum to determine the functionality of the plurality of frames, wherein the baseline checksum is generated from simulating the integrated circuit using design code.

10. The integrated circuit of claim 9, wherein the plurality of frames comprises a first frame and a second frame, wherein the first frame has a size that matches a size of the test pattern but the second frame lacks sufficient memory cells for storing the test pattern, wherein, when retrieving data stored in the first frame, the retrieved data matches the test pattern when the first frame is functioning properly, wherein, when retrieving data stored in the second frame, the retrieved data is different from the test pattern when the second frame is functioning properly.

11. The integrated circuit of claim 10, wherein the second frame returns a constant value for a portion of the test pattern that was unable to be stored in the second frame when storing the test pattern into each frame of the plurality of frames.

12. The integrated circuit of claim 9, further comprising:

a plurality of test controllers, wherein each of the plurality of test controllers is configured to test one row of the plurality of rows of functional blocks, and wherein the plurality of test controllers is configured to store the test pattern into each frame of the plurality of frames in parallel and generate a respective checksum for a corresponding row of the plurality of rows of functional blocks.

13. The integrated circuit of claim 9, wherein the plurality of frames are part of configuration memory used to configure the plurality of functional blocks to perform a desired user task, wherein the plurality of functional blocks comprises programmable logic.

14. The integrated circuit of claim 9, wherein the plurality of frames are arranged into a plurality of interleaved groups, wherein each of the plurality of interleaved group comprises multiple frames of the plurality of frames, wherein the test controller is configured to:

receive an invert interval, the invert interval comprising a ratio indicating when to invert the test pattern when storing the test pattern into the plurality of frames, wherein content of only one of the frames in each of the plurality of interleaved groups is inverted at any given time.

15. The integrated circuit of claim 14, wherein the test controller is configured to:
receive an updated invert interval;
store again the test pattern into each frame of the plurality of frames by repeatedly duplicating the test pattern using the updated invert interval, wherein content of a different one of the plurality of frames in each of the plurality of interleaved groups is inverted than when storing the test pattern into the plurality of frames using a previous invert interval;
retrieve data stored in the plurality of frames;
generate a second checksum from the retrieved data; and
compare the second checksum to a second baseline checksum to determine the functionality of the plurality of frames.

16. The integrated circuit of claim 15, wherein the test controller is configured to:
continue to update invert intervals until content of each frame in the plurality of interleaved groups is inverted during at least one test period, wherein inverting the content of each frame in the plurality of interleaved groups permits a testing application to determine whether there is a short between frames in a same interleaved group.

17. A testing system, comprising:
an integrated circuit;
a simulator configured to simulate design code of the integrated circuit to generate baseline checksums derived from storing a test pattern in simulated frames; and
a testing application configured to transmit the test pattern to the integrated circuit, receive checksums from the integrated circuit, and compare the checksums to the baseline checksums to determine whether a plurality of frames of configuration memory in the integrated circuit has a defect,
wherein the integrated circuit is configured to:
store the test pattern into each frame of the plurality of frames by repeatedly duplicating the test pattern, wherein the plurality of frames comprises non-uniform frames with varying sizes, and
generate the checksums from data retrieved from the plurality of frames.

18. The testing system of claim 17, wherein the plurality of frames comprises a first frame and a second frame, wherein the first frame has a size that matches a size of the test pattern but the second frame lacks sufficient memory cells for storing the test pattern,
wherein, when retrieving data stored in the first frame, the retrieved data matches the test pattern when the first frame is functioning properly,
wherein, when retrieving data stored in the second frame, the retrieved data is different from the test pattern when the second frame is functioning properly.

19. The testing system of claim 17, wherein the plurality of frames are arranged into a plurality of interleaved groups, wherein each of the plurality of interleaved group comprises multiple frames of the plurality of frames, wherein the integrated circuit is configured to:
receive an invert interval, the invert interval comprising a ratio indicating when to invert the test pattern when storing the test pattern into the plurality of frames, wherein content of only one of the frames in each of the plurality of interleaved groups is inverted at any given time.

20. The testing system of claim 19, wherein the integrated circuit is configured to:
receive an updated invert interval;
store again the test pattern into each frame of the plurality of frames by repeatedly duplicating the test pattern using the updated invert interval, wherein content of a different one of the plurality of frames in each of the plurality of interleaved groups is inverted than when storing the test pattern into the plurality of frames using a previous invert interval;
retrieve data stored in the plurality of frames;
generate a second checksum from the retrieved data; and
compare the second checksum to a second baseline checksum to determine a functionality of the plurality of frames.

* * * * *